(12) United States Patent
Shiraiwa et al.

(10) Patent No.: US 7,473,646 B2
(45) Date of Patent: Jan. 6, 2009

(54) DRY ETCHING METHOD AND PRODUCTION METHOD OF MAGNETIC MEMORY DEVICE

(75) Inventors: Toshiaki Shiraiwa, Kanagawa (JP); Tetsuya Tatsumi, Kanagawa (JP); Seiji Samukawa, 3-52, Aza Yoshinariyama, Aoba-ku, Imosawa, Sendai, Miyagi (JP) 989-3212

(73) Assignees: Sony Corporation, Tokyo (JP); Seiji Samukawa, Sendai (JP)

( * ) Notice: Subject to any disclaimer, the term of this patent is extended or adjusted under 35 U.S.C. 154(b) by 352 days.

(21) Appl. No.: 10/568,960

(22) PCT Filed: Aug. 26, 2004

(86) PCT No.: PCT/JP2004/012292

§ 371 (c)(1),
(2), (4) Date: Feb. 22, 2006

(87) PCT Pub. No.: WO2005/022622

PCT Pub. Date: Mar. 10, 2005

(65) Prior Publication Data

US 2007/0026681 A1    Feb. 1, 2007

(30) Foreign Application Priority Data

Aug. 27, 2003    (JP)    ............... 2003-303410

(51) Int. Cl.
*H01L 21/302* (2006.01)
*H01L 21/461* (2006.01)
(52) U.S. Cl. .............. 438/706; 438/712; 438/728; 438/729; 257/E21.006; 257/E21.218; 257/E21.229; 257/E21.252; 257/E21.485

(58) Field of Classification Search ................ 438/3, 438/9, 197, 200, 238, 381, 513, 692, 706, 438/712, 728, 729
See application file for complete search history.

(56) References Cited

U.S. PATENT DOCUMENTS 5,382,320 A * 1/1995 Desu et al. ............... 156/667

(Continued)

FOREIGN PATENT DOCUMENTS

JP    03-173125    7/1991

(Continued)

OTHER PUBLICATIONS

PCT International Search Report for PCT/JP2004/012292 mailed on Nov. 30, 2004.

(Continued)

*Primary Examiner*—David Nhu
(74) *Attorney, Agent, or Firm*—Rader, Fishman & Grauer PLLC; Ronald P. Kananen

(57) ABSTRACT

Provision of a process capable of preferably etching particularly PtMn used for a pin layer of an MRAM is an object: a dry etching method for performing dry etching on a layer including platinum and/or manganese by using pulse plasma and a production method of an MRAM, wherein the dry etching method is applied to processing of the pin layer. The MRAM is configured to have a memory portion comprising a magnetic memory element composed of tunnel magnetoresistive effect element formed by stacking a magnetic fixed layer having a fixed magnetization direction, a tunnel barrier layer and a magnetic layer capable of changing the magnetization direction.

5 Claims, 19 Drawing Sheets

U.S. PATENT DOCUMENTS

| | | | | |
|---|---|---|---|---|
| 5,387,315 | A | * | 2/1995 | Dandhu ................... 156/646 |
| 5,431,774 | A | * | 7/1995 | Douglas ................... 216/57 |
| 5,654,580 | A | * | 8/1997 | Beratan et al. ............. 257/467 |
| 5,705,443 | A | * | 1/1998 | Stauf et al. ................ 438/722 |
| 5,792,377 | A | * | 8/1998 | Belcher et al. ............. 216/87 |
| 5,870,135 | A | | 2/1999 | Glatt et al. |
| 6,551,852 | B2 | * | 4/2003 | Tuttle ...................... 438/73 |

FOREIGN PATENT DOCUMENTS

| | | |
|---|---|---|
| JP | 04-345026 | 12/1992 |
| JP | 07-273120 | 10/1995 |
| JP | 08-124902 | 5/1996 |
| JP | 09-092645 | 4/1997 |
| JP | 2002-030470 | 1/2002 |
| JP | 2002-280637 | 9/2002 |
| JP | 2003-31772 | 1/2003 |
| JP | 2003-031772 A | 1/2003 |
| JP | 2003-60169 | 2/2003 |
| JP | 2003-060169 A | 2/2003 |
| JP | 2003-133527 | 5/2003 |
| JP | 2003-197920 A | 7/2003 |
| JP | 2003-218326 | 7/2003 |
| JP | 2003-218326 A | 7/2003 |

OTHER PUBLICATIONS

Seiji Samukara, "Etching Gijutus no Saishin Doko", Focus Report 4, ED Research Sha, Jul. 1, 2002, pp. 3-15.

Japanese Office Action dated Sep. 21, 2007 in corresponding Japanese jAppln No. 2003-303410.

Seiji Sagawa, latest trend of etching technologies, ED research company, 2,002.07.01, p. 3-15 (Listed on p. 3 of the Japanese Office Action; Application No. 2003-303410; dated: Apr. 24, 2007.

Japanese Office Action; Application No. 2003-303410; Dated Apr. 24, 2007.

* cited by examiner

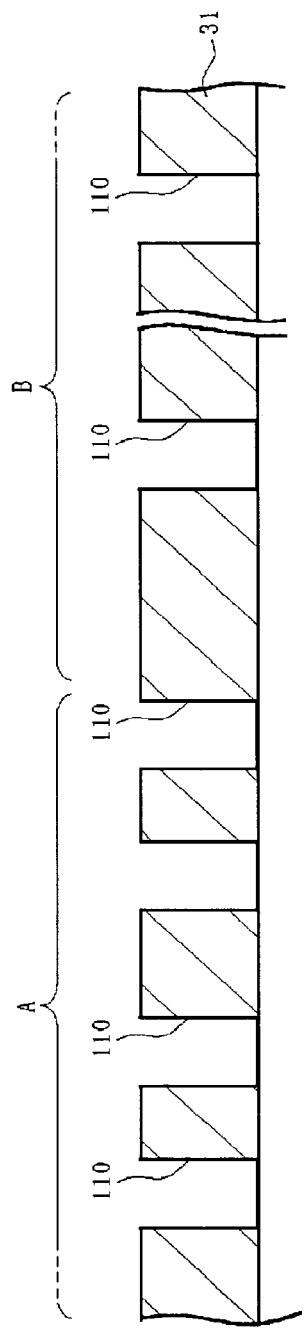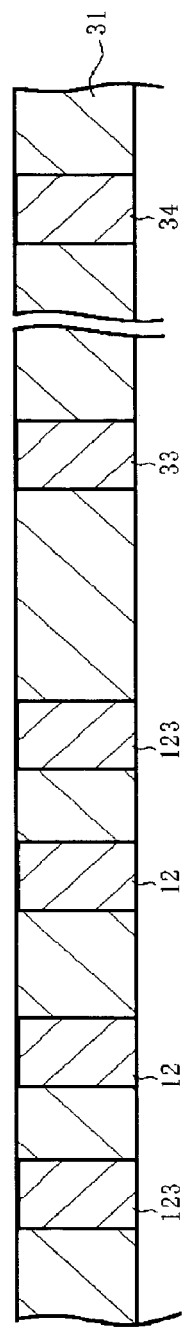
FIG. 8A
FIG. 8B

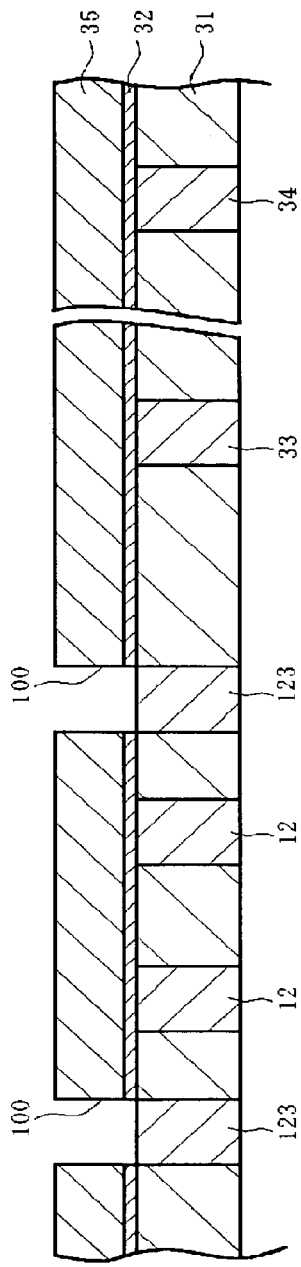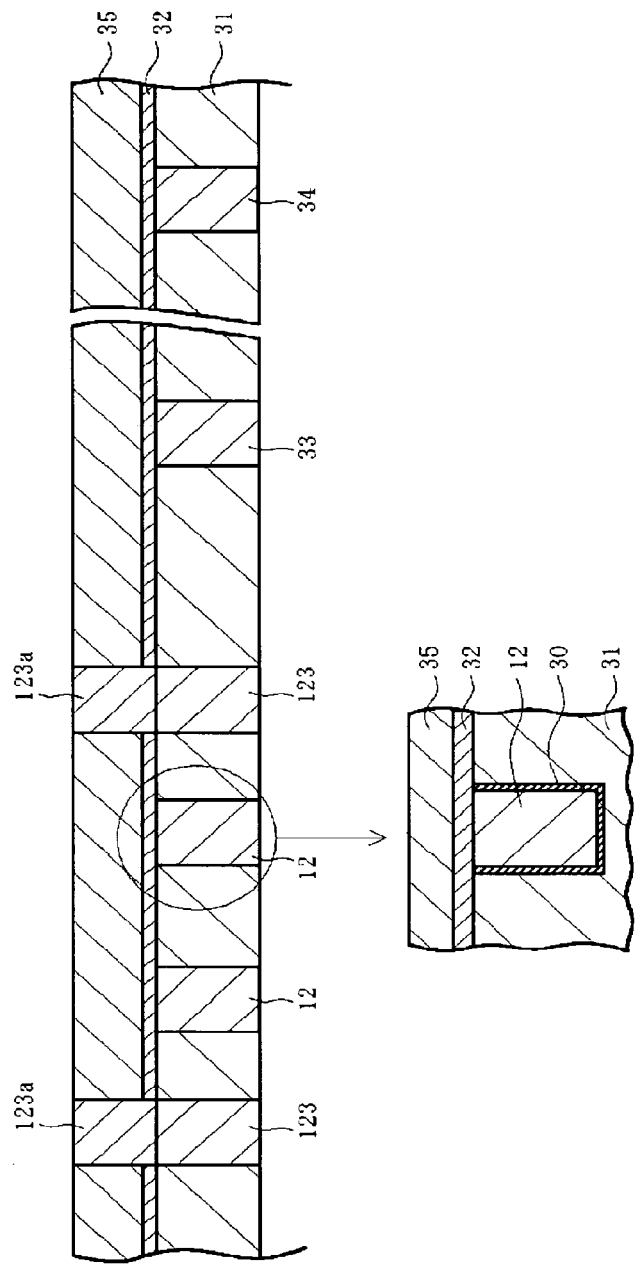
FIG. 9A
FIG. 9B

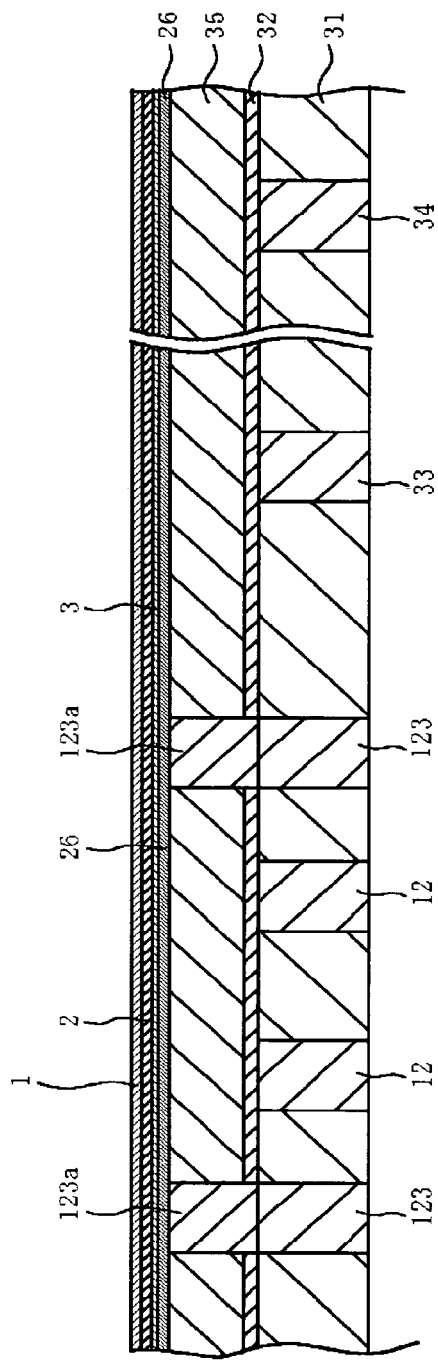
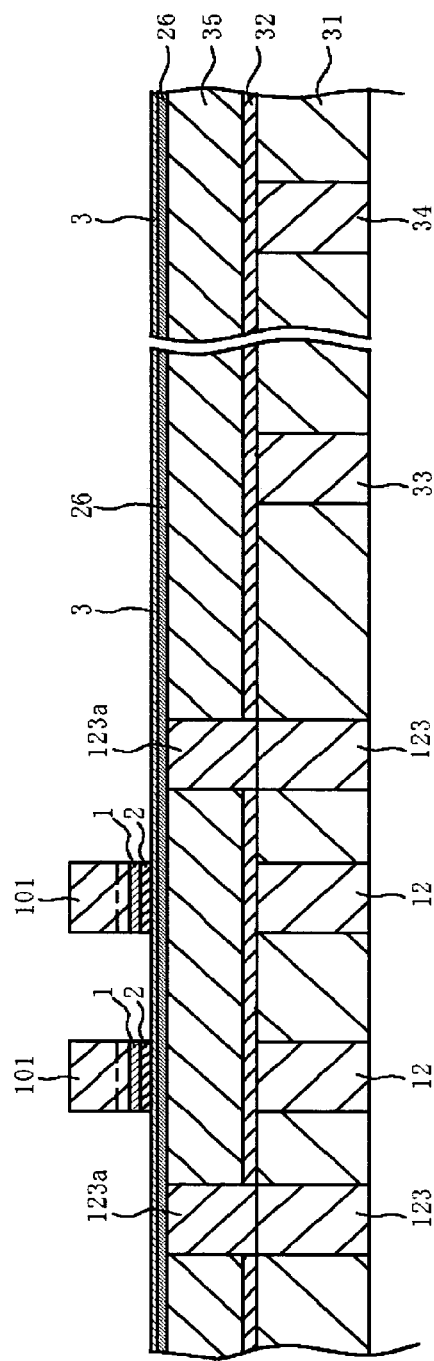
FIG. 10A
FIG. 10B

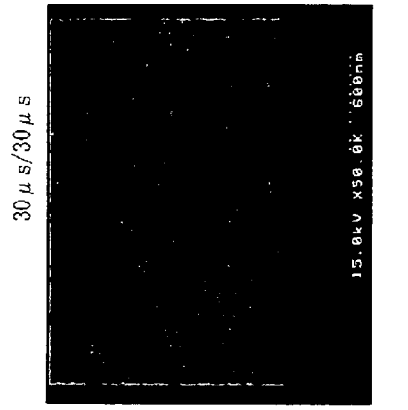
FIG. 17A CW
FIG. 17B 30 μs/10 μs
FIG. 17C 30 μs/30 μs
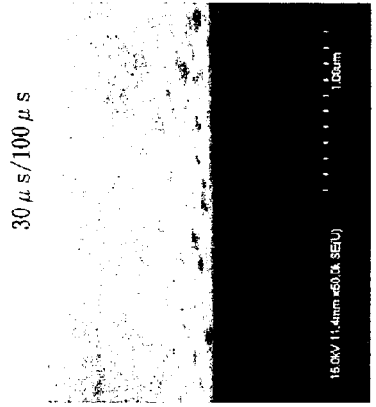
FIG. 17D 30 μs/50 μs
FIG. 17E 30 μs/70 μs
FIG. 17F 30 μs/100 μs
CORROSION LESS FIG. 18A
FIG. 18B
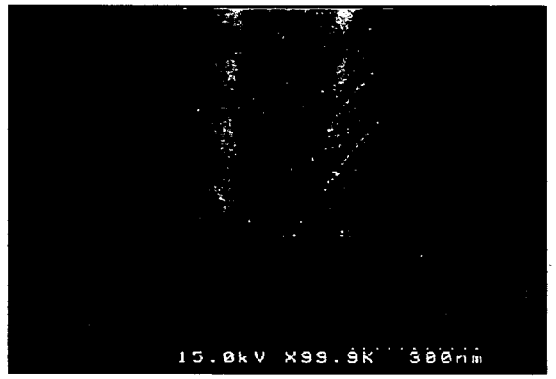
c w
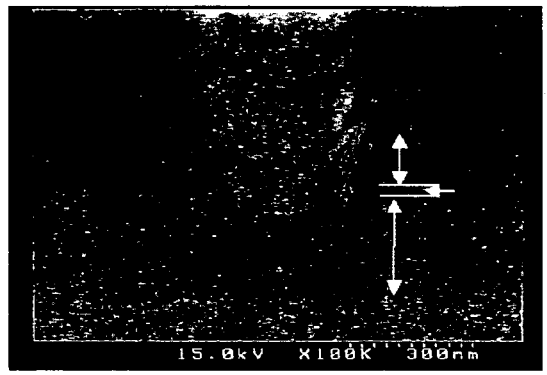
30 μ sec/100 μ sec

DRY ETCHING METHOD AND PRODUCTION METHOD OF MAGNETIC MEMORY DEVICE

TECHNICAL FIELD

The present invention relates to a dry etching method of a layer including platinum and/or manganese and a production method of a magnetic memory device using the layer (namely, a magnetic memory device having a memory portion comprising a magnetic memory element composed of a tunnel magnetoresistive effect element obtained by stacking a magnetization fixing layer having a fixed magnetization direction, a tunnel barrier layer and a magnetic layer capable of changing the magnetization direction; particularly, a magnetic random access memory; and a magnetic memory device configured as an MRAM (Magnetic Random Access Memory) as a so-called nonvolatile memory device).

BACKGROUND ART

Along with drastically spreading information communication apparatuses and, particularly, personal compact apparatuses, such as mobile devices; memories, logics and other elements composing them are required to have further higher performance, such as higher integration, higher speed and lower power consumption.

Particularly, higher density and a larger capacity of a nonvolatile memory have become more and more significant as a technique of replacing a hard disk basically unable to be more compact due to a movable portion therein and an optical disk.

As a nonvolatile memory, a flash memory using a semiconductor and a FRAM (Ferroelectric Random Access Memory) using ferroelectric substances, etc. may be also mentioned.

However, higher integration of a flash memory is difficult due to the complicated configuration, furthermore, there is a disadvantage that the access time is slow as 100 ns or so. On the other hand, an FRAM is pointed out to have a problem that the number of rewritable times is small.

As high speed nonvolatile memories with a large capacity (highly integrated) and low power consumption but not having the disadvantages as above, a magnetic memory generally called as an MRAM (Magnetic Random Access Memory) memory or MR (Magnetoresistance) memory as described, for example, in the non-patent article 1 has gathered attentions as a result of an improvement of characteristics of a TMR (Tunnel Magnetoresistance) material in recent years.

Moreover, it is expected to an MRAM that higher integration is easy due to the simple configuration, the number of rewritable times is large because recording is performed by rotation of the magnetic moment, and the access time is very high.

A TMR element used in the MRAM gathering attentions in recent years is formed to be configured that a tunnel oxidized film is sandwiched by two magnetic layers and used as a memory element by utilizing the fact that strength of a current flowing in the tunnel oxidized film changes in accordance with the direction of spins of the two magnetic layers.

The MRAM explained above will be explained further in detail. FIG. 1 is a schematic perspective view of a TMR element of an MRAM. The TMR element 10 to be a memory element of a memory cell of the MRAM includes a memory layer 2, wherein the magnetization is rotated relatively easily, and magnetization fixing layers 4 and 6 provided on a support substrate 9. The axis of easy magnetization A1 and the axis of difficult magnetization A2 are as illustrated in the drawing.

The magnetization fixing layer has two magnetization fixing layers: a first magnetization layer 4 and a second magnetization fixing layer 6. Between them is arranged a conductive layer 5, by which the magnetic layers are coupled antiferromagnetically. Nickel, iron, cobalt or ferromagnetic formed by alloys of them are used for the memory layer 2 and the magnetization fixing layers 4 and 6, and ruthenium, copper, chrome, gold and silver, etc. can be used as a material of the conductive layer 5. The second magnetization fixing layer 6 contacts with the antiferromagnetic layer 7, and an exchange interaction between the layers brings the second magnetization fixing layer 6 strong unidirectional magnetic anisotropy. As a material of the antiferromagnetic layer 7, iron, nickel, platinum, iridium, rhodium and other manganese alloy; cobalt and a nickel oxide, etc. may be used. Here, the magnetic fixing layers 4 and 6 and the antiferromagnetic layers 5 and 7 are sometimes included when referring to a pin layer (magnetization fixing layer) 26 (it will be the same below).

Also, between the memory layer 2 as a magnetic layer and the first magnetization fixing layer 4, a tunnel barrier layer 3 formed by an insulator composed of an oxide or nitride, etc. of aluminum, magnesium and silicon, etc. is sandwiched, which cuts magnetic coupling of the memory layer 2 and the magnetization fixing layer 4 and serves for flowing a tunnel current. These magnetic layer and conductive layer are mainly formed by a sputtering method, and the tunnel barrier layer 3 can be obtained by oxidizing or nitriding a metal film formed by sputtering. A topcoat layer 1 serves for preventing mutual dispersion and reducing contact resistance between a TMR element 10 and wiring connected to the TMR element and inhibiting oxidization of the memory layer 2, and a material, such as Cu, Ta and TiN, may be normally used. A base electrode layer 8 is used for connecting a switching element serially connected with the TMR element. The base electrode layer 8 is formed by Ta, etc. and it may also work as the antiferromagnetic layer 7.

In a memory cell configured as above, as will be explained later on, information is read by detecting a change of a tunnel current caused by the magnetic resistance effect and the effect depends on the relative magnetization direction of the memory layer and the magnetization fixing layer.

FIG. 2 is an enlarged simplified perspective view showing a part of a memory cell portion of a general MRAM. Here, while a read circuit portion is omitted for simplification, for example, 9 memory cells are included and bit lines 11 and write word lines 12 intersecting with each other are provided. TMR elements 10 are arranged at these intersections, and writing to the TMR elements 10 is performed by flowing a current to a bit line 11 and a write word line 12 and, by using a synthetic magnetic field of magnetic fields generated thereby, making the magnetization direction of the memory layer 2 of a TMR element 10 at an intersection of the bit line 11 and the write word line 12 to be in parallel or not-parallel to the magnetization fixing layer.

FIG. 3 is a schematic sectional view of a memory cell of an MRAM. For example, an n-type read field-effect transistor 19 composed of a gate insulation film 15 formed on a p-type well region 14 formed in a p-type silicon semiconductor substrate 13, a gate electrode 16, a source region 17 and a drain region 18 is arranged and, above thereof, a write word line 12, a TMR element 10 and a bit line 11 are arranged. A source region 17 is connected to a sense line 21 via a source electrode 20. The field-effect transistor 19 functions as a switching element for reading, and read wiring 22 drawn from between the word line 12 and the TMR element 10 is connected to a drain region 18 via a drain electrode 23. Note that the transistor 19 may be an n-type or p-type field-effect transistor and, other than that, a diode, bipolar transistor, MESFET (Metal Semiconductor Field Effect Transistor) and other variety of switching elements may be used.

FIG. 4 is an equivalent circuit diagram of an MRAM. A portion including, for example, 6 memory cells is shown. Mutually intersecting bit lines 11 and write word lines 12 are provided, and intersections of the writing lines are provided with a memory element 10, a field-effect transistor 19 connected to the memory element 10 and for selecting an element at the time of reading, and a sense line 21. The sense line 21 is connected to a sense amplifier 23 and detects stored information. Note that the reference number 24 in the figure indicates bidirectional write word line current drive circuit, and the reference number 25 indicates a bit line current drive circuit.

FIG. 5 is a magnetic field response characteristic diagram (asteroid curve) at the time of writing to an MRAM. Inverted thresholds in the memory layer magnetization direction caused by applied magnetic field $H_{EA}$ in the axis direction of easy magnetization and magnetic field $H_{HA}$ in the axis direction of difficult magnetization are shown. When an equivalent synthetic magnetic field vector is generated outside of the asteroid curve, magnetic field inversion arises, while, synthetic magnetic field vectors inside the asteroid curve do not invert the cell from one side in the current bistable state. Also, cells at other intersections than that of the current flowing word line and bit line are applied with a magnetic field generated by a word line or bit line alone. Therefore, when the size is larger than the unidirectional inverted magnetic field $H_K$, a magnetization direction of the cells at other intersections are also inverted, so that it is set that writing to the selected cell becomes possible only when the synthetic magnetic field is in a gray region in the figure.

As explained above, in the MRAM, it is general that the asteroid magnetization inversion characteristics are utilized by using two writing lines, that is, a bit line and a word line to selectively write only to a specified memory cell due to the inversion of magnetization spins. Synthetic magnetization in a single memory region is determined by vector synthesis of a magnetic field $H_{EA}$ in the axis direction of easy magnetization and a magnetic field $H_{HA}$ in the axis direction of difficult magnetization applied to that. A writing current flowing in the bit lines applies a magnetic field $H_{EA}$ in the axis direction of easy magnetization to cells, while a current flowing in the word lines applies a magnetic field $H_{HA}$ in the axis direction of difficult magnetization to the cells.

FIG. 6 is a schematic view for explaining a reading operation principle of an MRAM. Here, the layer configuration of the TMR element 10 is schematically illustrated, wherein the pin layer explained above is indicated as a single layer pin layer 26 and illustration of other portions than the memory layer 2 and the tunnel barrier layer 3 is omitted.

Namely, as explained above, in writing of information, magnetization spins MS of the cells are inverted by synthetic magnetic field at intersections of the bit lines 11 and word lines 12 wired in matrix and the directions are recorded as information of "1" and "0". Also, reading is performed by using a TMR effect applied from the magnetic resistance effect. The TMR effect is a phenomena that the resistance value changes in accordance with the direction of the magnetization spins MS, and "1" and "0" of information are detected based on a state where the magnetization spins MS has high not-parallel resistance and a state where the magnetization spins MS has low parallel resistance. The reading is performed by flowing of a reading current (tunnel current) I between the word lines 12 and bit lines 11 and reading outputs in accordance with high and low levels of the resistance as explained above to the sense line 21 through the read field-effect transistor 19 as explained above.

Main steps of a production method of an MRAM having the above conventional configuration will be explained with reference to FIG. 7A and FIG. 7B.

As shown in FIG. 7A, on an interlayer insulation film composed of a silicon oxide film formed on a substrate (not shown), on which a Tr (transistor) and a wiring layer are formed by using a CMOS technique; word lines 12 and read line 123 are formed as buried wiring in a memory portion A, and lower layer wiring 33 and 34 as buried wiring are formed in a peripheral circuit portion B.

A diffusion prevention film 32 formed by a silicon nitride film for preventing diffusion of copper ions of the wiring is formed on the word lines and the lower layer wiring 33 and 34 in the peripheral circuit portion B. After furthermore stacking an interlayer insulation film 35 composed of a silicon oxide film 35, wiring connection portions 123a are formed in contact holes 100 formed by opening by etching the interlayer insulation film 35 on the reading lines 123. On top of that, respective component layers of, for example, a pin layer 26 including Ta/PtMn/CoFe (a second pin layer)/Ru/CoFe (a first pin layer), a tunnel barrier layer 3 formed by $AlO_3$, a free layer 2 formed by CoFe-30B, and a topcoat layer 1 formed by TiN are stacked.

Then, to form a TMR element 10, by using a mask 101 composed of a stacked film of SiO/SiN formed to be a predetermined pattern, the topcoat layer 1 and the free layer 2 are etched above the word lines 12 to have a predetermined pattern and, furthermore, the whole surface is covered with an insulation film 102 of $SiO_2$, etc.

Note that, to form the buried wiring, it is sufficient if a copper diffusion barrier film formed, for example, by Ta is provided to wiring grooves, the Damascene method, etc. using the barrier film as a seed metal is performed to apply Cu by electrolytic plating, then, CMP (chemical mechanical polishing processing) is performed (it will be the same in other wiring below).

Next, as shown in FIG. 7B, by using other photoresist or a mask 103 composed of a stacked film of SiO/SiN having a predetermined pattern, the insulation film 102, tunnel barrier layer 3 and pin layer 26 are subjected to stacking etching to form the same pattern to separate between adjacent TMR elements 10 and to connect the respective TMR elements to the reading line 123 (123a) via the pin layer 26. At this time, the interlayer insulation film 35 is also partially etched.

Next, while the illustration is omitted, an interlayer insulation film and a diffusion prevention film are stacked, after forming contact holes (not shown) thereon, the contact holes are buried by Cu plating, then, bit lines are formed on the TMR elements 10 in the memory portion A and bit lines are connected to the lower wiring in the peripheral circuit portion B.

When producing an MRAM as explained above, in the element separation step in FIG. 7B, a method of performing etching on the tunnel barrier layer 3 to the pin layer 26 by ion milling using Ar ions may be considered so far (refer to the patent articles 1 and 2).

Patent Article 1: the Japanese Unexamined Patent Publication No. 2003-60169 (line 21 on right column on page 3 to line 8 on left column on page 4, FIG. 1(2) to (5))

Patent Article 2: the Japanese Unexamined Patent Publication No. 2003-31772 (lines 24 to 34 on left column on page 5, FIG. 1(3))

Non-patent Article 1: Wang et al. IEEE Trans. Magn. 33 (1997), 4498

DISCLOSURE OF THE INVENTION

As explained above, for example, when using physical etching (milling) by Ar ions used in a magnetic head forming technique to process the pin layer 26 formed, for example, by a manganese alloy of platinum (PtMn) to have a predetermined pattern, the milling processing basically has a disadvantage that a spattering substance adheres to sidewalls of the processed pattern because the pattern is formed by physical removal. As the countermeasure, a method of milling obliquely is used. In this method, however, there is a portion hidden by an adjacent pattern (shadowing) when the pattern is made finer, so that the miniaturization is limited.

Therefore, as is known in a normal semiconductor process, performing of dry etching (RIE) by reactive plasma using an effect bringing chemical reaction with it may be considered. A $Cl_2$ based gas system used in Al processing is normally used when etching PtMn, however, there are disadvantages that corrosion arises when being left after etching, which has been also a trouble in the case of Al, dimensional conversion difference (unevenness of dimensional accuracy) caused by adhesion of reaction product to the processed pattern side arises and, moreover, deterioration of reproducibility caused by adhesion of a reaction product to inside of an etching chamber (a processed shape changes because of changes of a discharging state due to adhesion of a reaction product) arises.

The present invention was made in consideration of the above disadvantages and has as an object thereof to provide a process, wherein particularly PtMn used for a pin layer of an MRAM can be preferably etched.

Namely, the present invention provides a dry etching method characterized by performing dry etching on a layer including platinum and/or manganese by using pulse plasma.

Also, the present invention provides a production method of a magnetic memory device having a memory portion comprising a magnetic memory element composed of a tunnel magnetoresistive effect element formed by stacking a magnetic fixed layer having a fixed magnetization direction, a tunnel barrier layer and a magnetic layer capable of changing the magnetization direction, wherein, when at least a part of the magnetization fixed layer is composed of a layer including platinum and/or manganese, the layer is formed by dry etching by pulse plasma.

According to the present invention, when processing a layer formed by platinum and/or manganese, for example PtMn, since etching is performed by using pulse plasma repeating on-time for generating plasma and off-time not generating plasma in a pulsing state, electrons adhere to ions to generate more active negative ions during the off-time of not generating plasma, consequently, reaction with an etching object is accelerated. As a result, etching particularly on PtMn having been difficult to be etched can be accelerated and, at that time, an etching rate of a silicon oxide film normally used as a mask does not exhibit any change, so that the selection ratio can be improved. Particularly, when performing dry etching by a $Cl_2$ gas system, residual chlorine decreases as a result of accelerating the reaction, so that arising of corrosion can be also suppressed. Also, due to an effect of the negative ions, which are chemically active, it is possible to prevent a reaction product from adhering to the processed pattern and suppress adhesion of the reaction product to inside of the chamber, so that it is effective when making the pattern finer and in mass production.

BRIEF DESCRIPTION OF THE DRAWINGS

FIG. 8A and FIG. 8B are schematic sectional views showing production processes of an MRAM according to an embodiment o the present invention.

FIG. 9A and FIG. 9B are schematic sectional views showing production processes of an MRAM according to an embodiment o the present invention.

FIG. 10A and FIG. 10B are schematic sectional views showing production processes of an MRAM according to an embodiment o the present invention.

FIG. 17A to FIG. 17F are enlarged pictures each showing a corrosion arising state after dry etching of an MRAM in an example 4.

FIG. 18A and FIG. 18B are enlarged pictures each showing a state after dry etching of an MRAM in an example 5.

EXPLANATION OF REFERENCES

Figure 1:
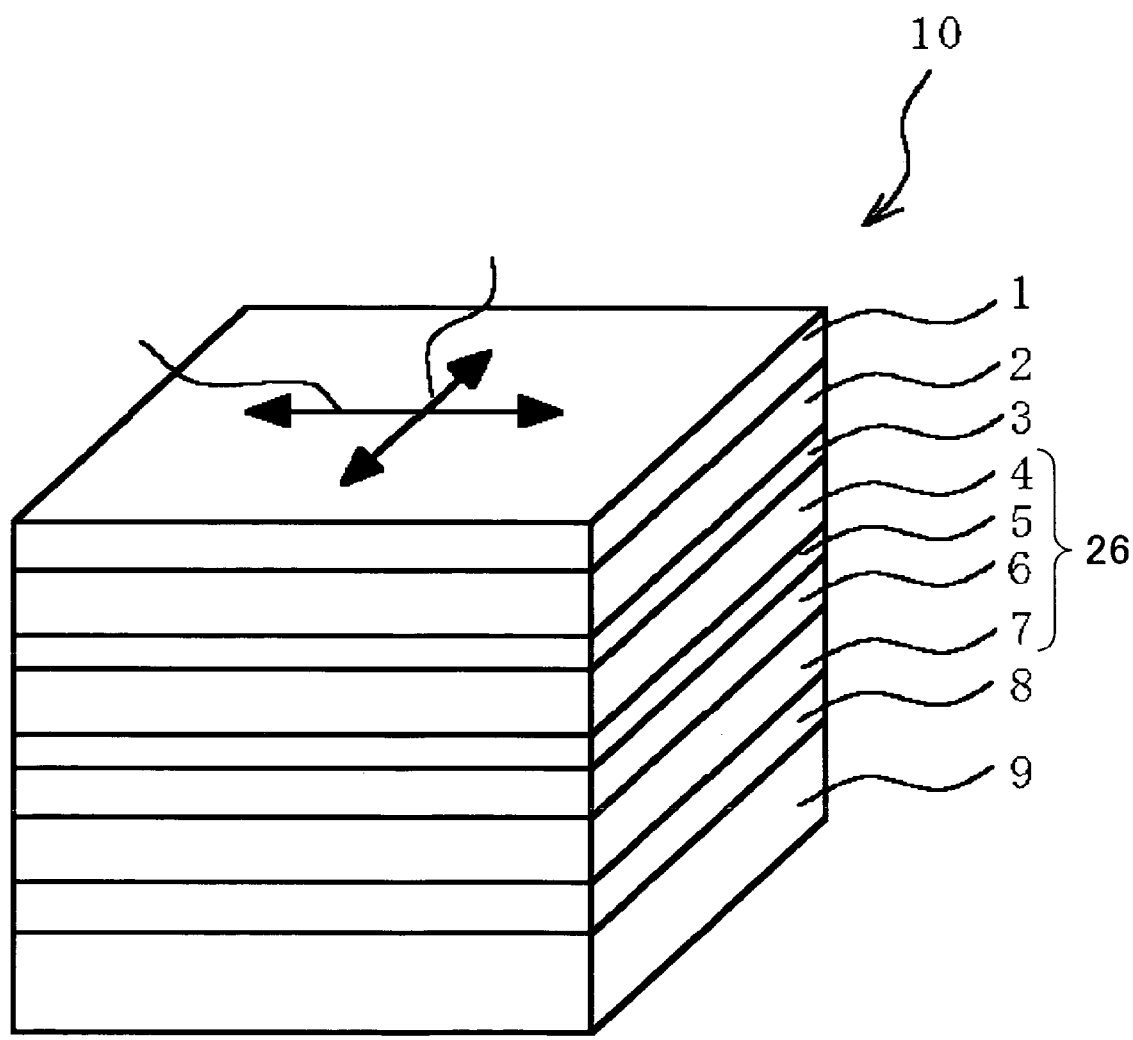
FIG. 1 is a schematic perspective view of a TMR element of an MRAM.
Figure 2:
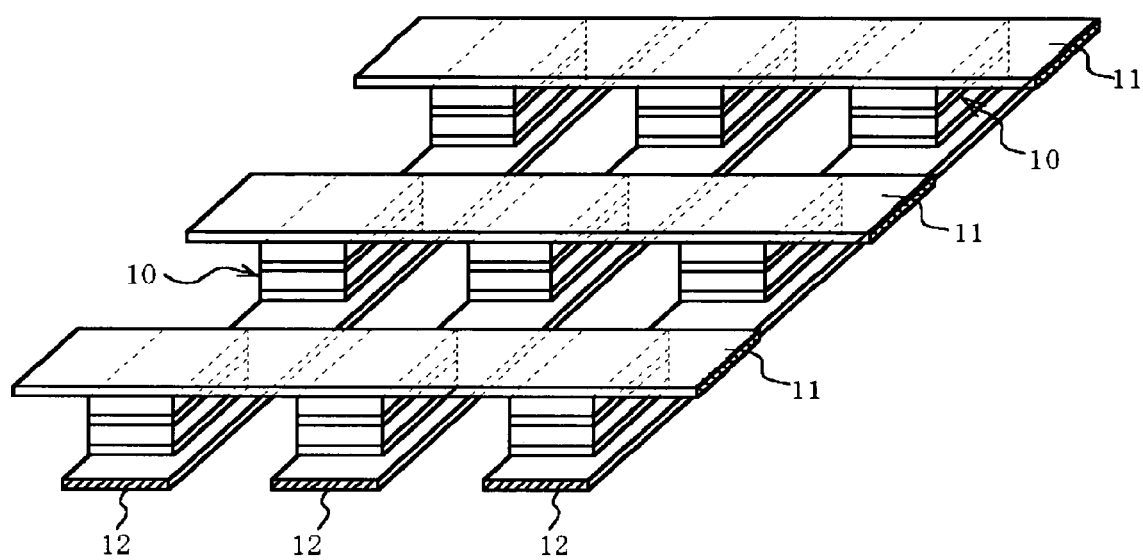
FIG. 2 is a view of a simplified and enlarged perspective view showing a part of a memory cell portion of a general MRAM.
Figure 3:
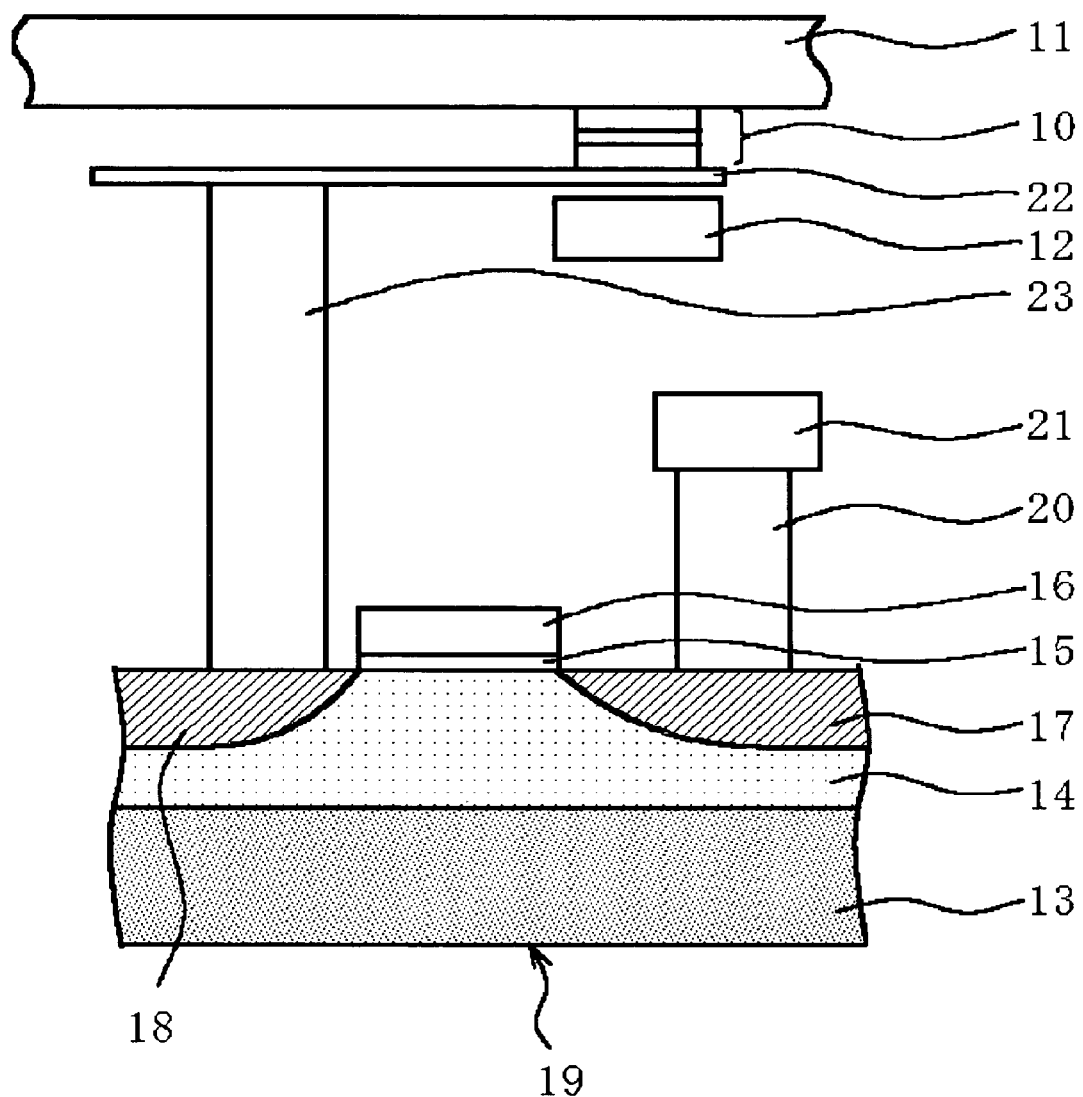
FIG. 3 is a schematic sectional view of a memory cell of an MRAM.
Figure 4:
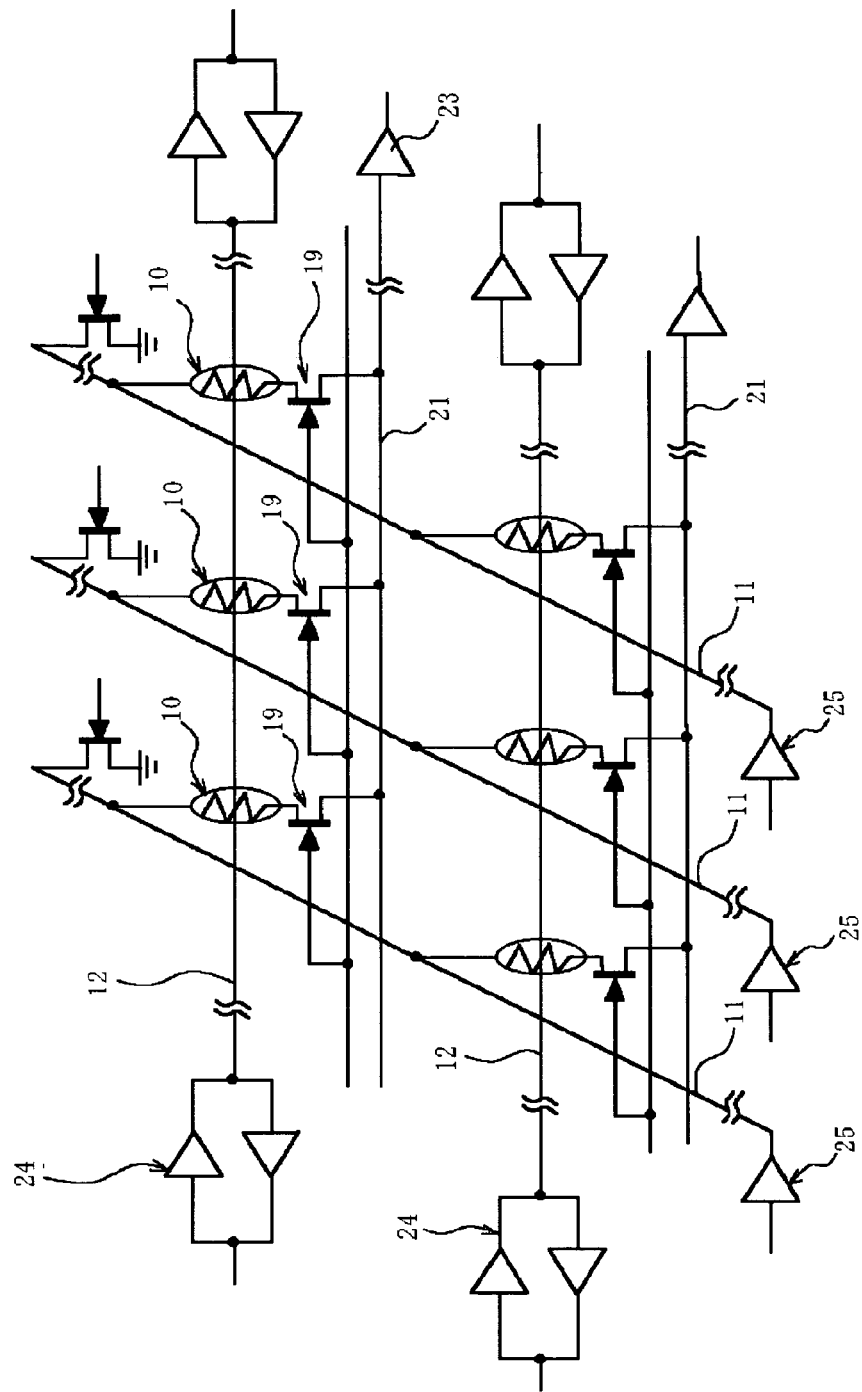
FIG. 4 is an equivalent circuit diagram of an MRAM.
Figure 5:
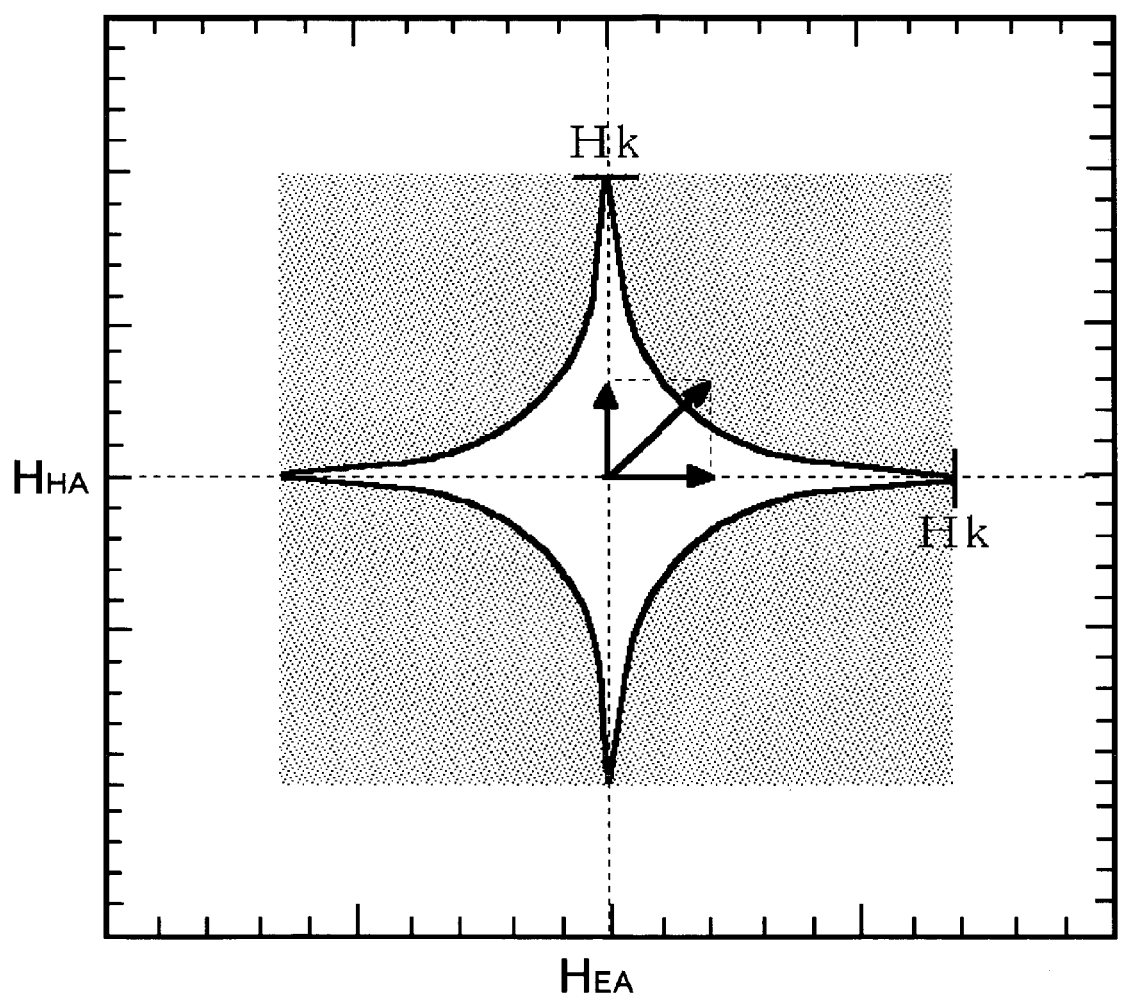
FIG. 5 is a magnetic field response characteristic view (asteroid curve) when writing to an MRAM.
Figure 6:
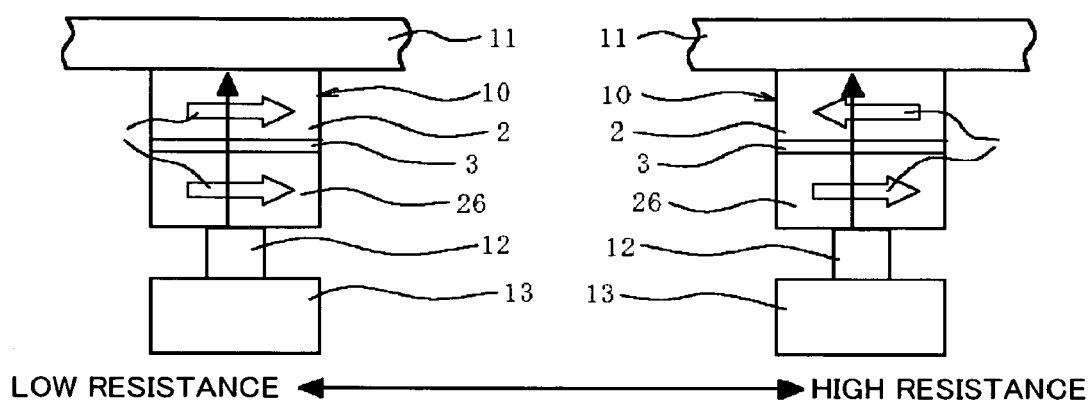
FIG. 6 is a schematic view for explaining a reading operation principle of an MRAM.
Figure 7A:
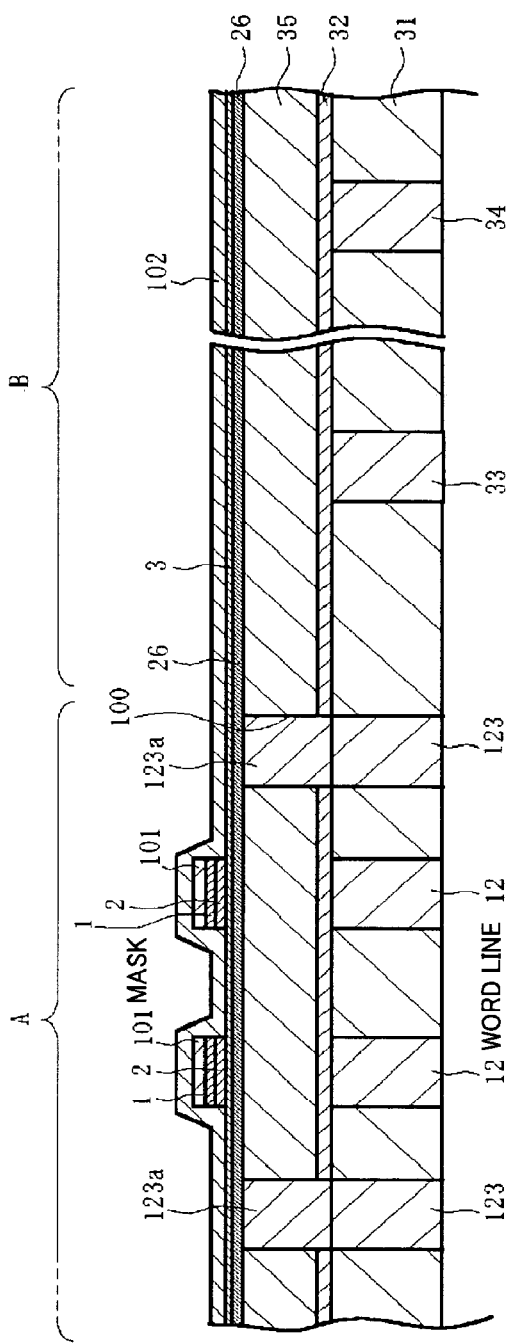
FIG. 7A and FIG. 7B are schematic sectional views showing production processes of an MRAM according to a conventional example.
Figure 7B:
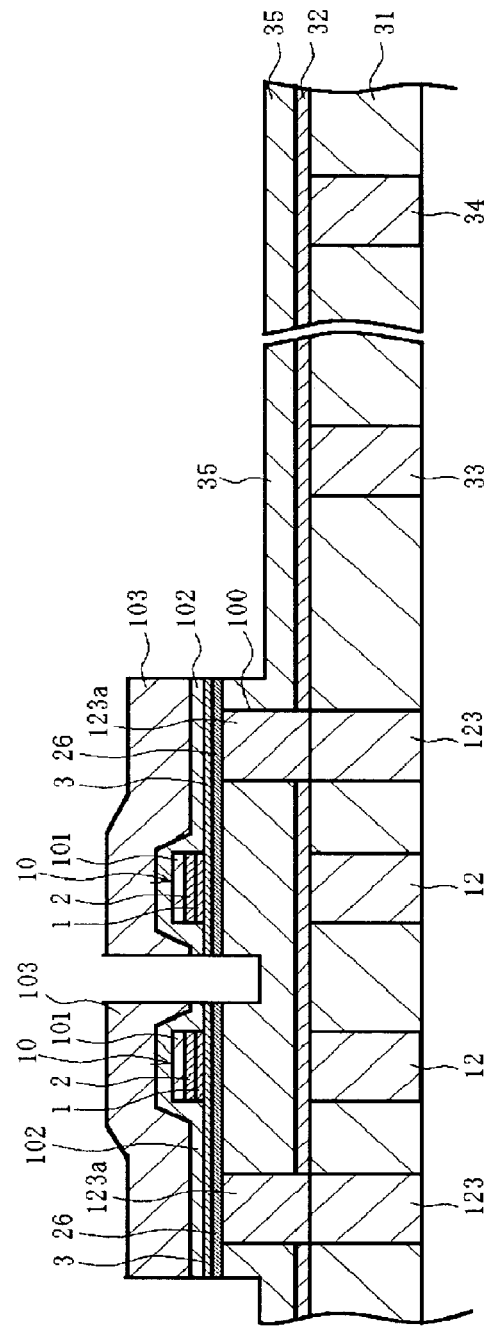

1 . . . topcoat layer, 2 . . . memory layer (free layer), 3 . . . tunnel barrier layer, 4 . . . first magnetization fixing layer, 5 . . . antiferromagnetically coupling layer, 6 . . . second magnetization fixing layer, 7 . . . antiferromagnetic layer, 8 . . . base layer, 9 . . . support substrate, 10 . . . TMR element, 11 . . . bit line, 12 . . . writing word line, 12a and 33a . . . contact plague, 13 . . . silicon substrate, 14 . . . well region, 15 . . . gate insulation film, 16 . . . gate electrode, 17 . . . source region, 18 . . . drain region, 19 . . . reading field-effect transistor (selecting transistor), 20 . . . source electrode, 21 . . . sense line, 22 ... wiring, 24 ... word line current drive circuit, 25 ... bit line current drive circuit, 26 ... pin layer (magnetization fixing layer), 30 ... barrier film, 110 and 120 ... wiring groove, 31, 35, 40, 42 and 105 ... interlayer insulation film, 32, 43 and 106 ... diffusion prevention film, 33 and 34 ... lower layer wiring, 101 and 103 ... mask, 102 and 104 ... insulation film, 123 ... reading line, A ... memory portion, B ... peripheral circuit portion.

BEST MODE FOR CARRYING OUT THE INVENTION

Below, an embodiment of a dry etching method and a production method of a magnetic memory device according to the present invention will be explained.

A dry etching method according to the present embodiment is characterized by performing dry etching by using pulse plasma on a layer including platinum and/or manganese.

Also, the production method of a magnetic memory device according to the present embodiment is a production method of a magnetic memory device having a memory portion comprising a magnetic memory element composed of a tunnel magnetoresistive effect element formed by stacking a magnetic fixed layer having a fixed magnetization direction, a tunnel barrier layer and a magnetic layer capable of changing the magnetization direction, wherein, when at least a part of the magnetization fixed layer is composed of a layer including platinum and/or manganese, the layer is formed by dry etching by pulse plasma.

In the present embodiment, to accelerate the effect as above, preferably, on/off time of the pulse plasma is 10 to 100 µs. When the on/off time is too short or too long, the negative ions are hard to be generated effectively.

Also, a plasma source capable of turning on/off generation of the plasma is preferably used, and electron cyclotron resonance (ECR), inductively-coupled plasma (ICP) or a helicon wave may be used.

Also, it is preferable to use a gas capable of generating negative ions as an etching gas, and at least one kind of gases including at least chloride atom or a mixed gas thereof is preferably used for that.

Also, by adding plasma processing for preventing corrosion by a gas including at least hydrogen atom, residual chlorine is reduced and arising of corrosion can be furthermore effectively suppressed.

As a reducing gas as above, at least one kind of gases including at least hydrogen atom, such as $H_2$, $NH_3$, $CH_3OH$ and $H_2O$, a mixed gas thereof, or a mixed gas obtained by adding a rare gas, such as Ar, to any one of them is used as the gas.

The dry etching method of the present embodiment is preferable for producing a magnetic memory device (MRAM) configured that an insulation layer or a conductive layer is sandwiched by the magnetization fixing layer and the magnetic layer, information is written by magnetizing the magnetic layer in a predetermined direction by a magnetic field generated by flowing currents respectively to a bit line and word line provided to an upper surface and lower surface of the memory element, and the written information is read by a tunnel magnetoresistive effect via the tunnel barrier layer.

Below, a preferable embodiment of the present invention will be explained further in detail with reference to the drawings.

The present embodiment is an MRAM, wherein the present invention is applied, and the production method will be explained in an order of the steps. In the process below, for example, when burying Cu to contact holes, a diffusion barrier layer made by Ta, etc. is formed and surface polishing by CMP is performed after the burying, but these steps may not be explained. Also, formation of a mask includes a step of a photolithography technique, etc.

FIG. 8 to FIG. 13 are schematic sectional views showing the production method process of the MRAM according to the present embodiment.

First, as shown in FIG. 8A, in a memory portion A of a substrate in which transistors are formed, for example, by using a CMOS technique and a wiring layer is formed (neither of them are shown), contact holes 110 are formed by lithography and etching on an interlayer insulation film 31 composed, for example, of a silicon oxide film.

Next, as shown in FIG. 8B, Cu is buried in the respective contact holes 110 via a diffusion barrier layer (not shown) by electrolytic plating of Cu and CMP (chemical mechanical polishing) thereon, word lines 12 and reading lines 123, for example, having a thickness of 400 nm are formed in the memory portion A, and lower layer wiring 33 and 34 are formed in the same way in the peripheral circuit portion B.

Next, as shown in FIG. 9A, a silicon nitride film to be a diffusion prevention film 32 and a silicon oxide film as an interlayer insulation film 35 are stacked to be thicknesses of, for example, 30 nm and 100 nm respectively by a CVD (chemical vapor deposition) method and, furthermore, by lithography and etching, contact holes 100 with wiring for connecting to TMR elements are formed. Note that the interlayer insulation film 35 is not necessarily formed and the diffusion prevention film may also serve as an interlayer insulation film.

Next, as shown in FIG. 9B, Cu is buried in contact holes 27 by electrolytic plating of Cu and CMP thereon, wiring connection portions 123a for connecting TMR elements and the lower layer wiring 123 are formed. Note that all of the wiring connection portions 123a and wiring 12, 33 and 34 (later explained other buried wiring is the same) are formed by burying of Cu plating via a diffusion barrier layer, such as Ta.

Next, as shown in FIG. 10A, respective component layers of, for example, a pin layer 26 composed of Ta (a thickness of 3 mm)/PtMn (a thickness of 30 nm)/CoFe (a thickness of 2.4 nm)/Ru (a thickness of 0.75 mm)/CoFe (a thickness of 2.2 nm); a tunnel barrier layer 3 composed of $Al_2O_3$ (a thickness of 1.5 nm); a free layer 2 composed of CoFe-30B (a thickness of 4 nm); and a topcoat layer 1 composed of Ta (a thickness of 5 nm)/TiN (a thickness of 50 nm) are stacked in order by a sputtering method, etc.

Next, as shown in FIG. 10B, a mask 101 required at the time of processing an element component layer is formed to be a predetermined pattern. As the mask 101, for example, stacked films of a silicon nitride film having a thickness of 65 nm/silicon oxide film having a thickness of 250 nm are stacked by a CVD method and etching is performed for patterning by using a resist (not shown) having a predetermined pattern formed thereon.

Next, by using the mask 101, dry etching is performed on the topcoat layer 1 and free layer 2 to form an element pattern. By this etching, the mask layer 101 is made to be a thin film like a phantom line.

Figure 11A:
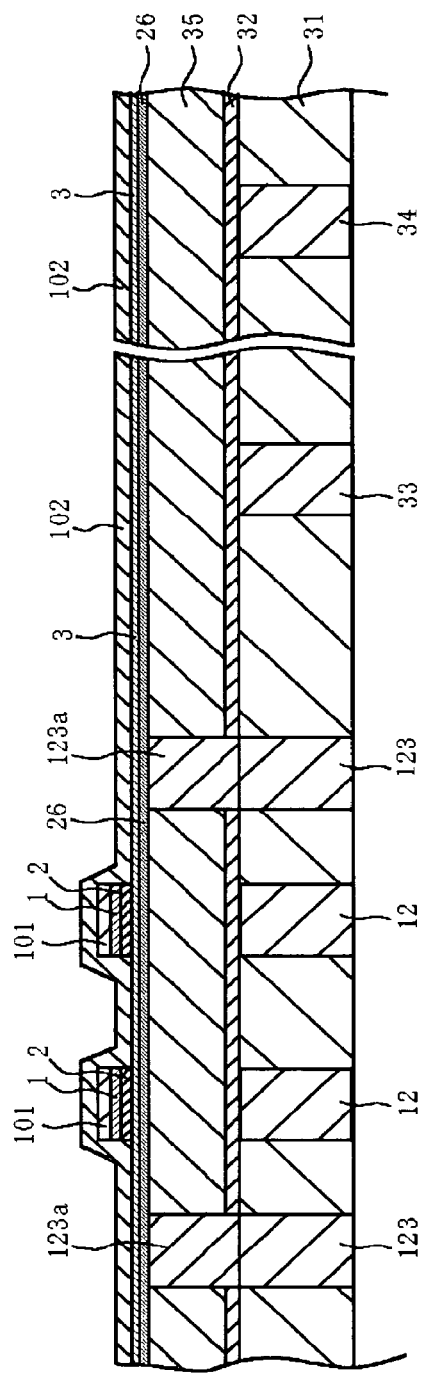
FIG. 11A and FIG. 11B are schematic sectional views showing production processes of an MRAM according to an embodiment o the present invention.
Figure 11B:
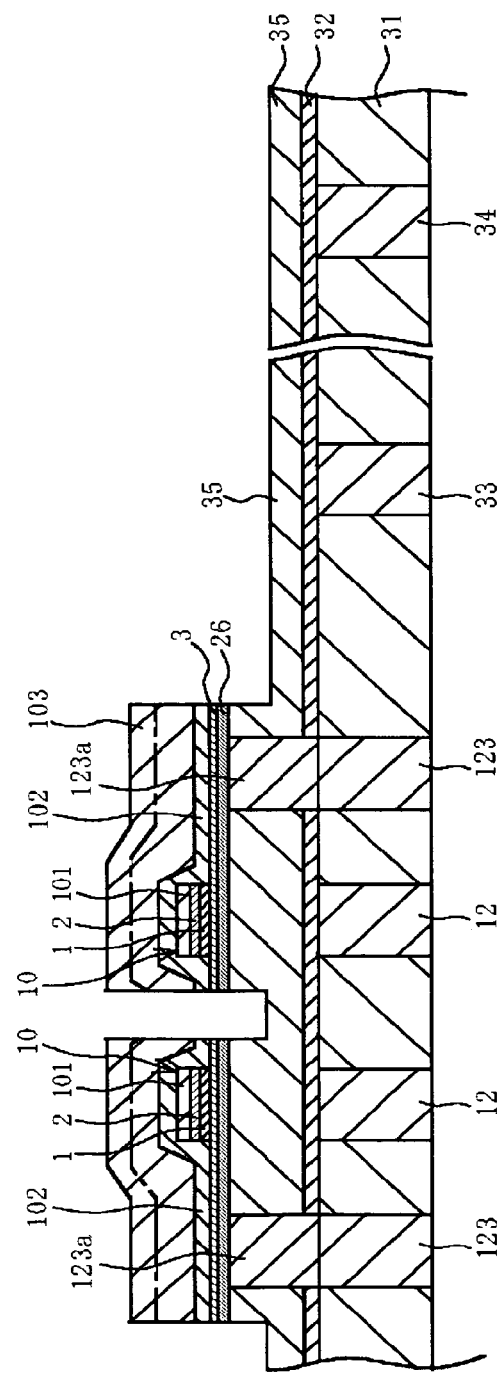

Next, as shown in FIG. 11A, after forming an insulation film 102 composed of a silicon oxide film allover the surface by a CVD method, as shown in FIG. 11B, a mask 103 is formed again in the memory portion A by a CVD method. The mask 103 is formed, for example, by stacked films of a silicon nitride film having a thickness of 65 nm/silicon oxide film having a thickness of 250 nm.

Next, by using the mask 103, the insulation film 102, tunnel barrier layer 3 and pin layer 26 are subjected to dry etching by pulse plasma to have a same pattern, adjacent TMR elements 10 are separated, and the TMR elements 10 are connected to reading lines 123 (123a) via the pin layer 26. At this time, the mask 103 is made to be a thin film like a phantom line.

Figure 12A:
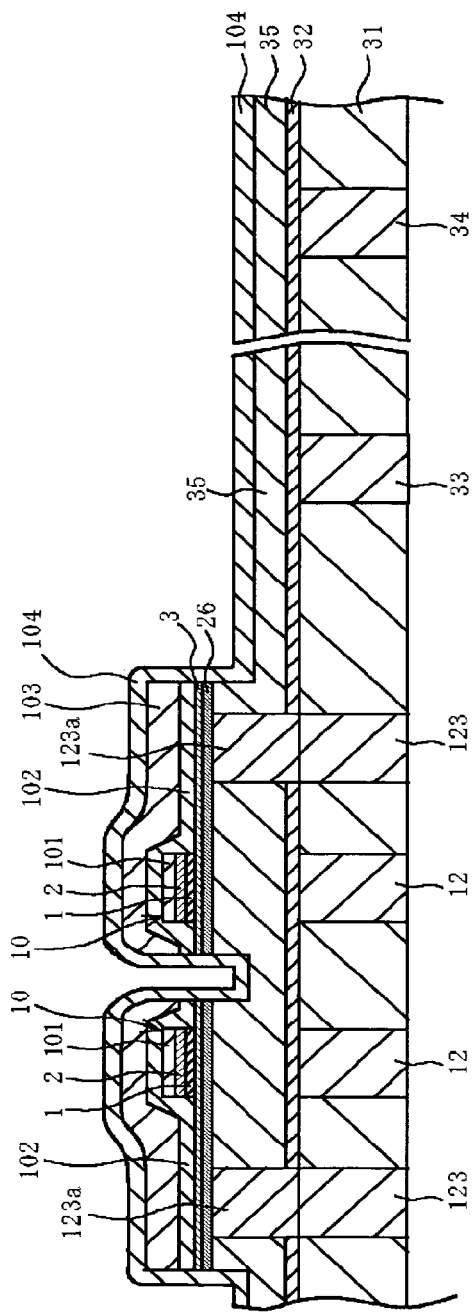
FIG. 12A and FIG. 12B are schematic sectional views showing production processes of an MRAM according to an embodiment o the present invention.
Figure 12B:
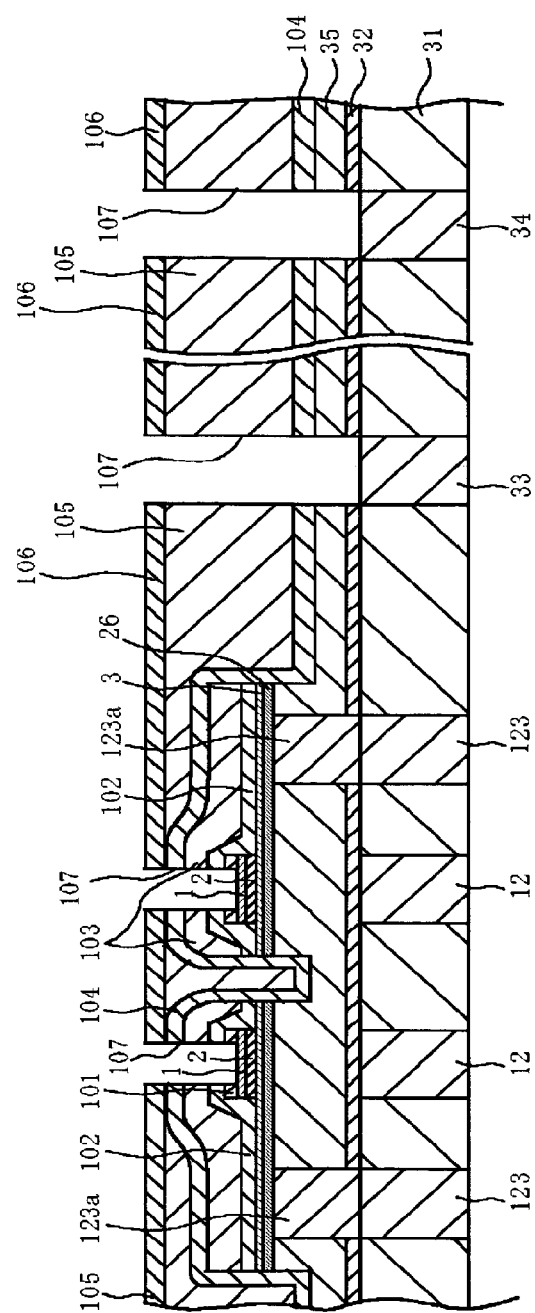

The dry etching by pulse plasma is performed, for example, by an ECR (electron cyclotron resonance) type etching device under the condition below.

a $Cl_2$ supply amount=50 sccm, chamber internal pressure=2 mTorr, ECR power=1000 W (2.5 GHz), bias=100 W (600 kHz), substrate (stage) temperature=30° C., chamber wall temperature=150° C., On/Off time of ECR power source=30 μs/30 μs, etching time=90 s Furthermore, to prevent corrosion of the pin layer 26 (particularly PtMn) caused by residual $Cl_2$, post-processing is performed under the condition below.

a $H_2$ supply amount=50 sccm, chamber internal pressure=2 mTorr, ECR power=1000 W (2.5 GHz), bias=100 W (600 kHz), substrate (stage) temperature=30° C., chamber wall temperature=150° C., processing time=60 s Next, as shown in FIG. 12A and FIG. 12B, after forming an insulation film 104 and an interlayer insulation film 105 on the upper surface including the mask 103, the interlayer insulation film 105 is flattened by CMP and, after furthermore forming a diffusion prevention film 106 formed by SiN, a resist mask (not shown) is formed and etched, as a result, contact holes 107 are formed on the TMR element 10 in the memory portion A and lower layer wiring 33 and 34 in the peripheral circuit portion B.

Figure 13:
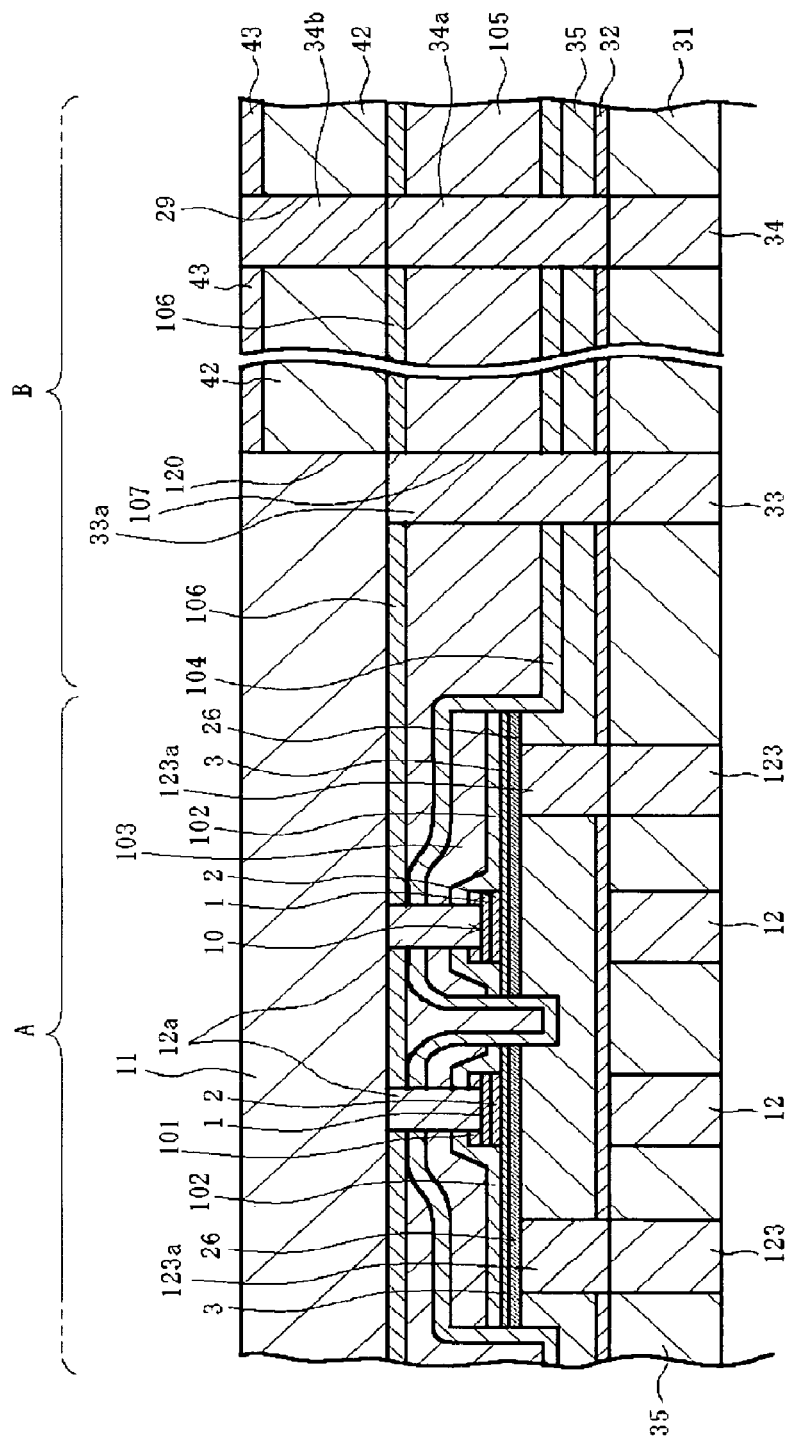
FIG. 13 is a schematic sectional view showing a production process of an MRAM according to an embodiment o the present invention.

Next, as shown in FIG. 13, Cu is buried by plating in the contact holes to form contact plagues 12a in the memory portion A, and contact plagues 33a and 34a for connecting the lower layer wiring 33, bit lines and upper wiring are formed in the peripheral circuit portion B.

Next, after forming an interlayer insulation film 42 and diffusion prevention film 43, a resist mask (not shown) is formed and etched, as a result, wiring grooves 120 for bit lines are formed and contact holes 29 in the peripheral circuit portion B are formed. Then, by plating of Cu and CMP, bit lines 11 are formed and upper layer wiring 34b is formed in the contact hole 29. While not illustrated, in the peripheral circuit portion B, an electrode is formed in a pad opening formed on the interlayer insulation film and connected to an external apparatus, etc., so that an MRAM is completed.

According to the present embodiment, in the step in FIG. 11B, since dry etching is performed from the tunnel barrier layer 3 to the pin layer 26, particularly, processing of a PtMn layer is performed by pulse plasma using $Cl_2$ as a reaction gas, when repeating in a pulsing way on-time for generating plasma and off-time for not generating plasma, active negative ions are generated as a result that electrons adhere to ions and, thus, reaction with an etching object is accelerated (Cl of the material gas is discomposed during on-time, and ions and radicals are generated). As a result, etching particularly on PtMn having been hard to be etched can be accelerated.

EXAMPLE 1

Figure 14:
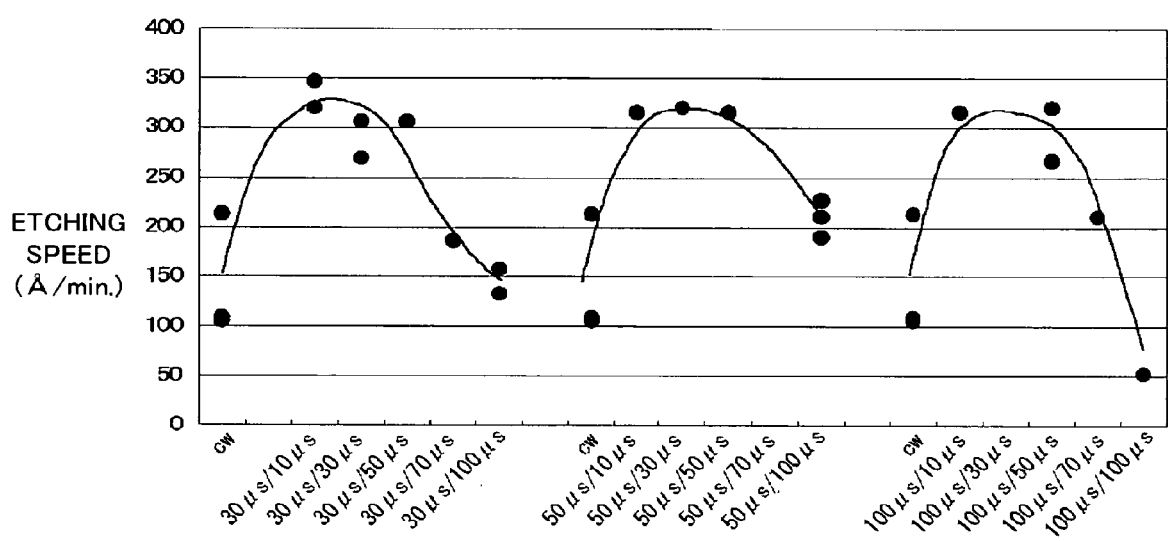
FIG. 14 is a graph showing changes of etching speed against on/off time of pulse plasma at the time of dry etching of a pin layer. (PtMn layer) of an MRAM in an example 1.

FIG. 14 is a graph showing changes of etching speed against on/off time of pulse plasma at the time of dry etching of the pin layer (PtMn layer) of the MRAM according to the present embodiment, wherein the ordinate axis indicates etching speed and the abscissa axis indicates on/off time of pulse plasma. The etching condition was $Cl_2$ of 2 mTorr, ECR of 1 kW, bias of 100 W (600 kHz), a substrate temperature of 30° C., chamber wall temperature of 150° C. and etching time of 90 s.

It indicates that the etching speed of PtMn improves by selecting an on/off rate of the pulse plasma and, when the on/off time is set from 10 to 100 s to attempt to raise the etching rate, it is known that it is particularly preferable to set the on-time to 30 to 100 μs and off-time to 10 to 50 μs (note that "CW" in the graph indicates continuous wave (it will be the same below)).

EXAMPLE 2

Figure 15:
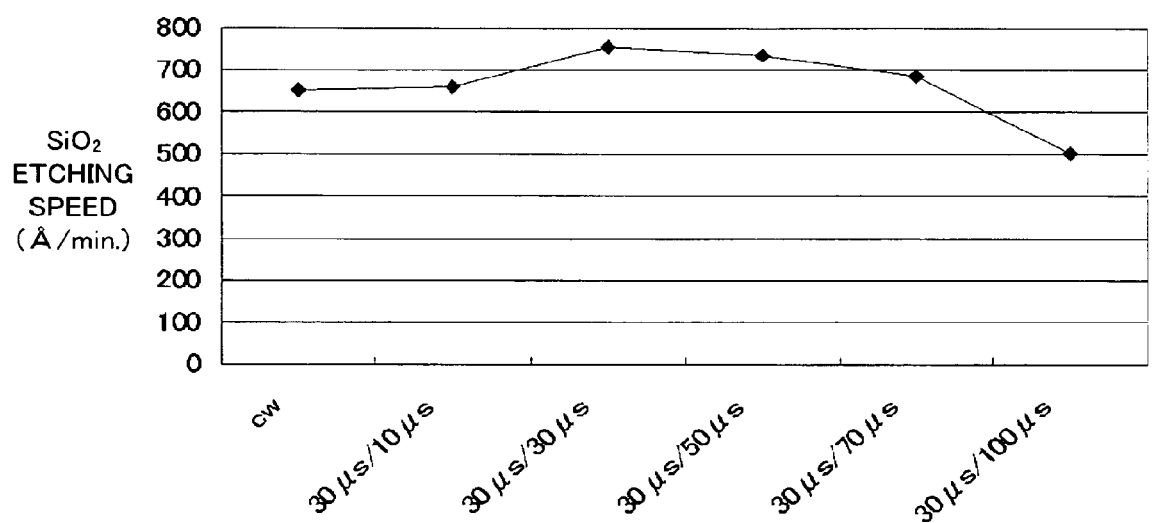
FIG. 15 is a graph showing etching speed of a $SiO_2$ mask at the time of dry etching of an MRAM in an example 2.

FIG. 15 is a graph showing etching speed of a $SiO_2$ mask at the time of dry etching of the MRAM of the present embodiment, wherein the ordinate axis indicates etching speed of $SiO_2$ and the abscissa axis indicates on/off time of pulse plasma. The etching condition was $Cl_2$ of 2 mTorr, ECR of 1 kW, bias of 100 W (600 kHz), a substrate temperature of 30° C. and chamber wall temperature of 150° C.

It was confirmed that the etching rate of the silicon oxide film 103 normally used as a mask in the above dry etching did not exhibit any change and the selection rate can be improved.

EXAMPLE 3

Figure 16:
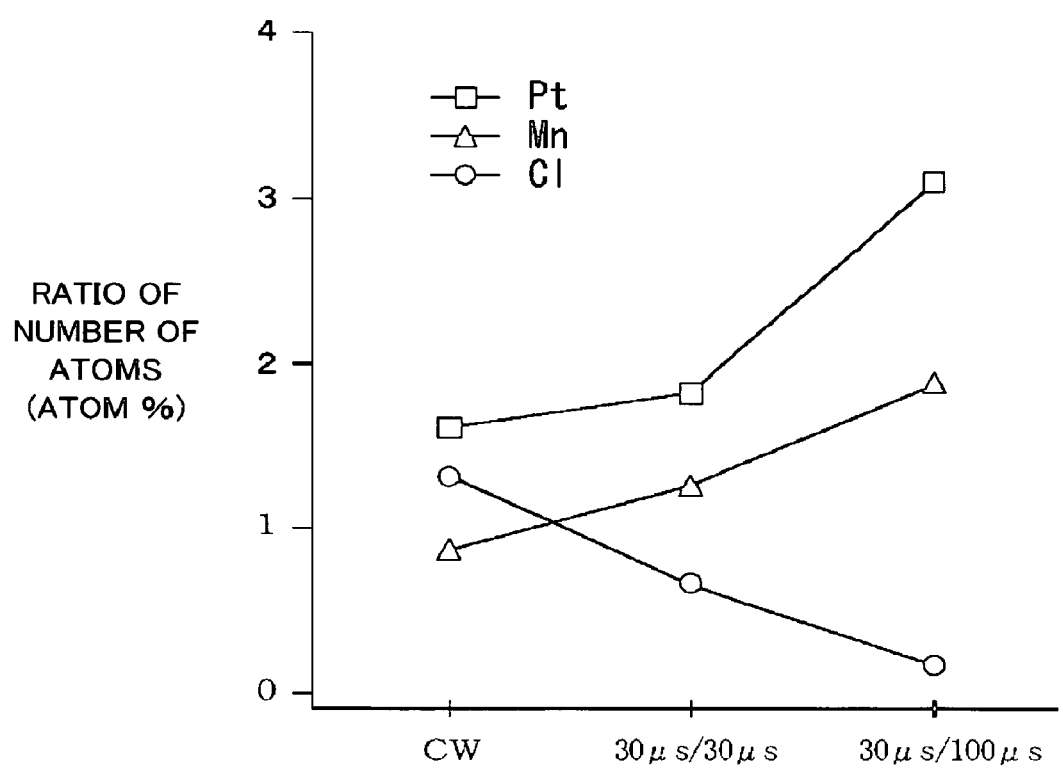
FIG. 16 is a graph showing residual element amount after dry etching of an MRAM in an example 3.

FIG. 16 is a graph showing residual element amount after dry etching of an MRAM according to the present embodiment, and results of element analysis on the wafer surface by EDX are shown. The ordinate axis indicates rates of the number of atoms (atom %) and the abscissa axis indicates on/off time of pulse plasma. The etching condition was $Cl_2$ of 2 mTorr, ECR of 1 kW, bias of 100 W (600 kHz), a substrate temperature of 30° C., chamber wall temperature of 150° C. and etching time of 90 s.

When performing dry etching by using a $Cl_2$ based gas system, as a result that the reaction is accelerated, residual chlorine reduces as shown in FIG. 16.

EXAMPLE 4

FIG. 17A to FIG. 17F are enlarged pictures each showing a corrosion arising state after dry etching of an MRAM according to the present embodiment, wherein on/off time of the pulse plasma in respective pictures are CW in FIG. 17A, 30 μs/10 μs in FIG. 17B, 30 μs/30 μs in FIG. 17C, 30 μs/50 μs in FIG. 17D, 30 μs/70 μs in FIG. 17E and 30 μs/100 μs in FIG. 17F. The etching condition was $Cl_2$ of 2 mTorr, ECR of 1 kW, bias of 100 W (600 kHz), a substrate temperature of 30° C., chamber wall temperature of 150° C. and etching time of 90 s. Measurement was made after 5 hours from finishing of the etching. Corrosion arose after 1 to 2 hours.

As is known from FIG. 17A to FIG. 17F, when performing dry etching by using a $Cl_2$ based gas system, residual chlorine reduces, so that it is also possible to suppress arising of corrosion, which is considered to generate unevenness on the surface.

EXAMPLE 5

FIG. 18A and FIG. 18B are enlarged pictures each showing a state after dry etching of an MRAM according to the embodiment of the present invention, and results of samples having a pattern are shown. The on/off time of the pulse plasma in respective pictures is CW in FIG. 18A and 30 μs/100 μs in FIG. 18B. The etching condition was $Cl_2$ of 2 mTorr, ECR of 1 kW, bias of 100 W (600 kHz), a substrate temperature of 30° C., chamber wall temperature of 150° C. and over etching of 50%.

In the TM (Time Modulation) plasma expressing pulse discharging, arising of corrosion was reduced and etching of the PtMn layer was realized.

In this case, in terms of suppressing arising of corrosion, the longer the off-time is, the better, and the off-time of 100 µs is preferable.

EXAMPLE 6

Figure 19:
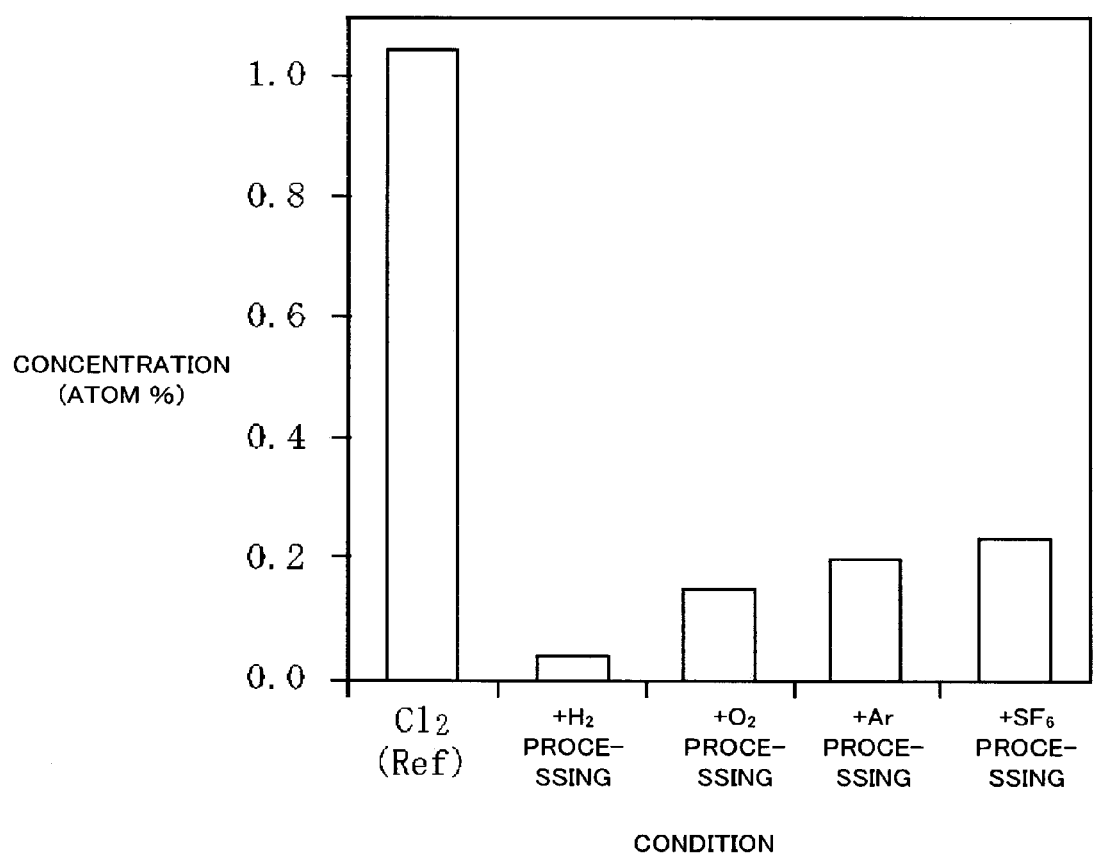
FIG. 19 is a graph showing a result of reduction processing by $H_2$, etc. after dry etching of an MRAM in an example 6.

FIG. 19 is a graph showing a result of reduction processing by $H_2$, etc. after dry etching of an MRAM according to the embodiment of the present invention. The ordinate axis indicates concentration (atom %) of residual chlorine by EDX after reduction processing by $H_2$, etc. after dry etching, and the abscissa axis indicates condition of the reduction processing, and results of performing processing by plasmas of $H_2$, $O_2$, Ar and $SF_6$ only on processing by $Cl_2$ as the reference (Ref) in the graph. The irradiation conditions were ECR/bias=1000 W/100 W and TM of the dry etching was 30 µs/30 µs.

When performing plasma processing by a gas system including H after the dry etching by pulse plasma, residual chlorine is reduced to be removed as shown in FIG. 19 and arising of corrosion can be furthermore prevented. The effect is also observed in the case of plasma of $O_2$, Ar and $SF_6$. Note that in the case of only processing by $Cl_2$ in FIG. 19, the value is different from that shown in FIG. 16 but it is considered to be caused by unevenness.

Also, due to the effect of the chemically active negative ions, adhesion of a reaction product to the processed pattern can be prevented and adhesion of the reaction product to inside the chamber can be also suppressed, so that it is effective when making a pattern more accurate and finer and in mass production.

As explained above, according to the method of the present embodiment, dimensional conversion difference of the pin layer is small in the production steps of the MRAM and corrosion can be suppressed, so that the elements can be made finer and easily produced.

The embodiment explained above may be variously modified based on the technical concept of the present invention.

For example, a component of the pin layer is not limited to PtMn and may be Pt or Mn, and components of other layers may be variously changed. The reading wiring for connecting TMR elements and reading lines may be formed only by the lower limit Ta and the PtMn layer thereon in the pin layer. In that case, in the step in FIG. 10B, etching by using the mask 101 has to be controlled to stop on the PtMn layer.

Also, as a plasma source capable of turning on and off generating of the pulse plasma explained above, inductively-coupled plasma (ICP) or a helicon wave may be used other than the electron cyclotron resonance (ECR).

In that case, it is preferable to use a gas capable of generating negative ions as the etching gas, and at least one kind of gases including at least chloride atom, such as HCl and $BCl_3$, in addition to $Cl_2$ or a mixed gas thereof may be preferably used.

Also, it is preferable to add plasma processing for preventing corrosion caused by a gas including at least hydrogen atom, and at least one kind of gases including at least hydrogen atom, such as $NH_3$, $CH_3OH$ and $H_2O$, in addition to $H_2$, a mixed gas thereof, or a mixed gas obtained by adding Ar or other rare gas to them may be preferably used.

Also, the layer configuration, component and film thickness of the TMR element, a material and film thickness of each mask, and a material and film thickness of the diffusion prevention film may be suitably changed. Also, the process of forming the MRAM is not limited to the embodiment.

INDUSTRIAL APPLICABILITY

The present invention is suitable to an MRAM, but it can be also applied to other magnetic memory devices composed of a memory element having a magnetizable magnetic layer, furthermore, the MRAM of the present invention can be used like a ROM by fixing the magnetization direction.

The invention claimed is:

1. A dry etching method for performing dry etching on a layer including platinum and/or manganese by using pulse plasma,
    wherein on/off time of said pulse plasma is 10 to 100 µs.

2. A dry etching method as set forth in claim 1, wherein a plasma source capable of turning on/off generation of said plasma is used.

3. A dry etching method as set forth in claim 2, wherein electron cyclotron resonance (ECR), inductively-coupled plasma (ICP) or a helicon wave is used as said plasma source.

4. A dry etching method for performing dry etching on a layer including platinum and/or manganese by using pulse plasma.
    wherein a gas capable of generating negative ions is used as an etching gas,
    wherein at least one kind of gases including at least chloride atom or a mixed gas thereof is used as said etching gas.

5. A dry etching method for performing dry etching on a layer including platinum and/or manganese by using pulse plasma,
    wherein plasma processing for preventing corrosion by a gas including at least hydrogen atom is added,
    wherein at least one kind of gases including at least hydrogen atom, a mixed gas thereof, or a mixed gas obtained by adding a rare gas to any one of them is used as said gas.

* * * * *